United States Patent [19]
Hihara

[11] Patent Number: 5,291,072
[45] Date of Patent: Mar. 1, 1994

[54] CROSSTALK-REDUCED TRANSMISSION DEVICE

[75] Inventor: Naoki Hihara, Amagasaki, Japan

[73] Assignee: Mitsubishi Denki Kabushiki Kaisha, Tokyo, Japan

[21] Appl. No.: 818,269

[22] Filed: Jan. 8, 1992

[30] Foreign Application Priority Data

Jan. 17, 1991 [JP] Japan .................. 3-015714

[51] Int. Cl.⁵ .......................................... H03K 5/08
[52] U.S. Cl. ................................ 307/303.1; 370/6; 361/784; 361/785
[58] Field of Search ................ 307/303; 370/6; 361/412, 413

[56] References Cited

U.S. PATENT DOCUMENTS

| | | | |
|---|---|---|---|
| 2,681,384 | 6/1954 | Guanella | 370/6 |
| 3,980,973 | 9/1976 | Hecken | 333/28 R |
| 4,352,179 | 9/1982 | Dabney | 370/6 |
| 4,508,981 | 4/1985 | Dorler et al. | 307/303 |
| 4,937,466 | 6/1990 | Osterkamp et al. | 307/264 |

FOREIGN PATENT DOCUMENTS 10677 6/1983 Japan .
10879 4/1989 Japan .

*Primary Examiner*—William L. Sikes
*Assistant Examiner*—Scott A. Ouellette
*Attorney, Agent, or Firm*—Rothwell, Figg, Ernst & Kurz

[57] ABSTRACT

In a transmission device having a first transmission path which is provided on a first printed circuit board and is connected to a connector, and over which a signal which does not vary with time is transmitted, and a second transmission path which is provided on a second printed circuit board and is connected to a second connector, and over which the above-mentioned signal is transmitted, a first resistor is connected to couple the second transmission path with a power supply of the second printed circuit board, and a first capacitor connected to couple the second transmission path with the ground. The first transmission path may also be grounded via a capacitor. The capacitive coupling to the ground will effectively ground the transmission path, and the crosstalk from another transmission path over which a signal which varies with time is transmitted is reduced.

17 Claims, 4 Drawing Sheets

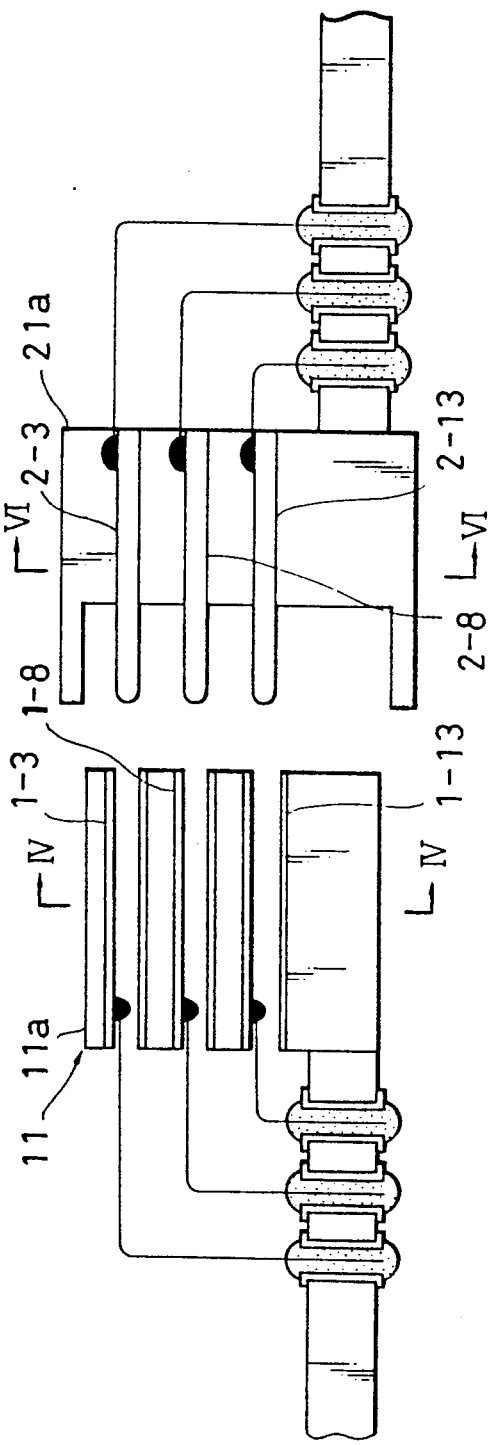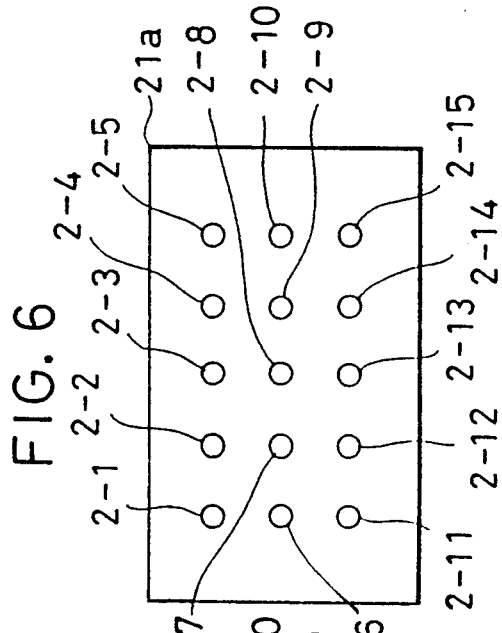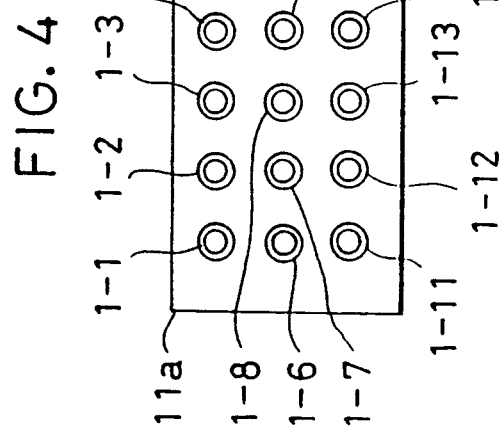

CROSSTALK-REDUCED TRANSMISSION DEVICE

BACKGROUND OF THE INVENTION

The present invention relates to a transmission device including circuit components formed on a printed circuit board provided with a connector and with an arrangement for reducing crosstalk in the connector.

Electrical connection between printed circuit boards is often achieved by means of connectors which are fixed to the respective printed circuit boards, and are engaged and electrically connected with each other. Such connectors may be formed of a block of an insulating material and pins extending parallel with each other and from one side to the opposite side of the block. One of the connectors which are engaged with each other has male-type pins, while the other connector has female-type pins which mate with the male-type pins.

A problem associated with such type of connectors is crosstalk between pins. This crosstalk is increased as the distance between the pins is shorter, and as the signal transmitted through the pins has higher frequency components. To reduce the crosstalk, some of the pins in the connectors may be grounded, but this means that the number of pins available for transmitting signals is decreased.

SUMMARY OF THE INVENTION

An object of the invention is to reduce crosstalk between pins in the connectors without decreasing the number of pins available for transmission of signals.

According to the invention, there is provided a transmission device having a first transmission path which is provided on a first printed circuit board and is connected to a connector, and over which a signal which does not vary with time is transmitted, and a second transmission path which is provided on a second printed circuit board and is connected to a second connector, and over which the above-mentioned signal is transmitted. A first resistor is connected to couple the second transmission path with a power supply of the second printed circuit board, and a first capacitor is connected to couple the second transmission path with the ground. The first transmission path may also be grounded via a capacitor. The capacitive coupling to the ground will effectively ground the transmission path, and the crosstalk from another transmission path over which a signal which varies with time is transmitted is reduced.

If the number of pins connected to the transmission paths which are grounded by a capacitor in the above-described manner are disposed to surround a pin connected to the transmission path for a signal which varies with time, the crosstalk is even further reduced.

BRIEF DESCRIPTION OF THE DRAWINGS

FIG. 3 is a cross-sectional view showing a first one of the pair of connectors in FIG. 1.

FIG. 4 is a sectional view along line IV—IV in FIG. 3.

FIG. 5 is a cross-sectional view showing a second one of the pair of connectors in FIG. 1.

FIG. 6 is a sectional view along line VI—VI in FIG. 5.

DETAILED DESCRIPTION OF THE PREFERRED EMBODIMENTS

Figure 1:
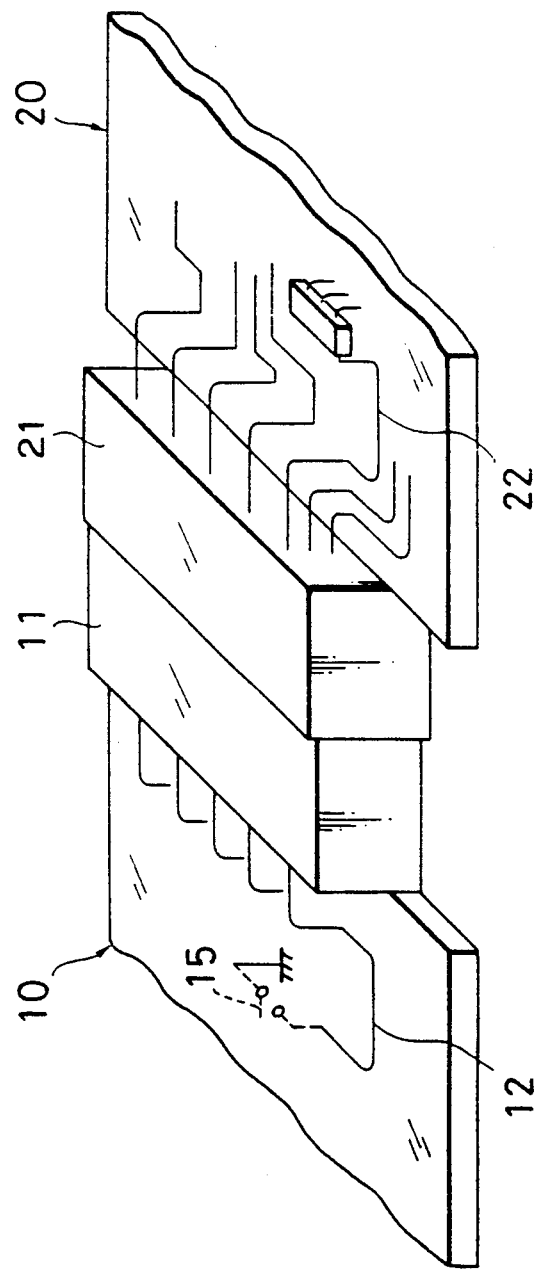
FIG. 1 is a perspective view showing a pair of printed circuit boards connected with each other through a pair of connectors.
Figure 2:
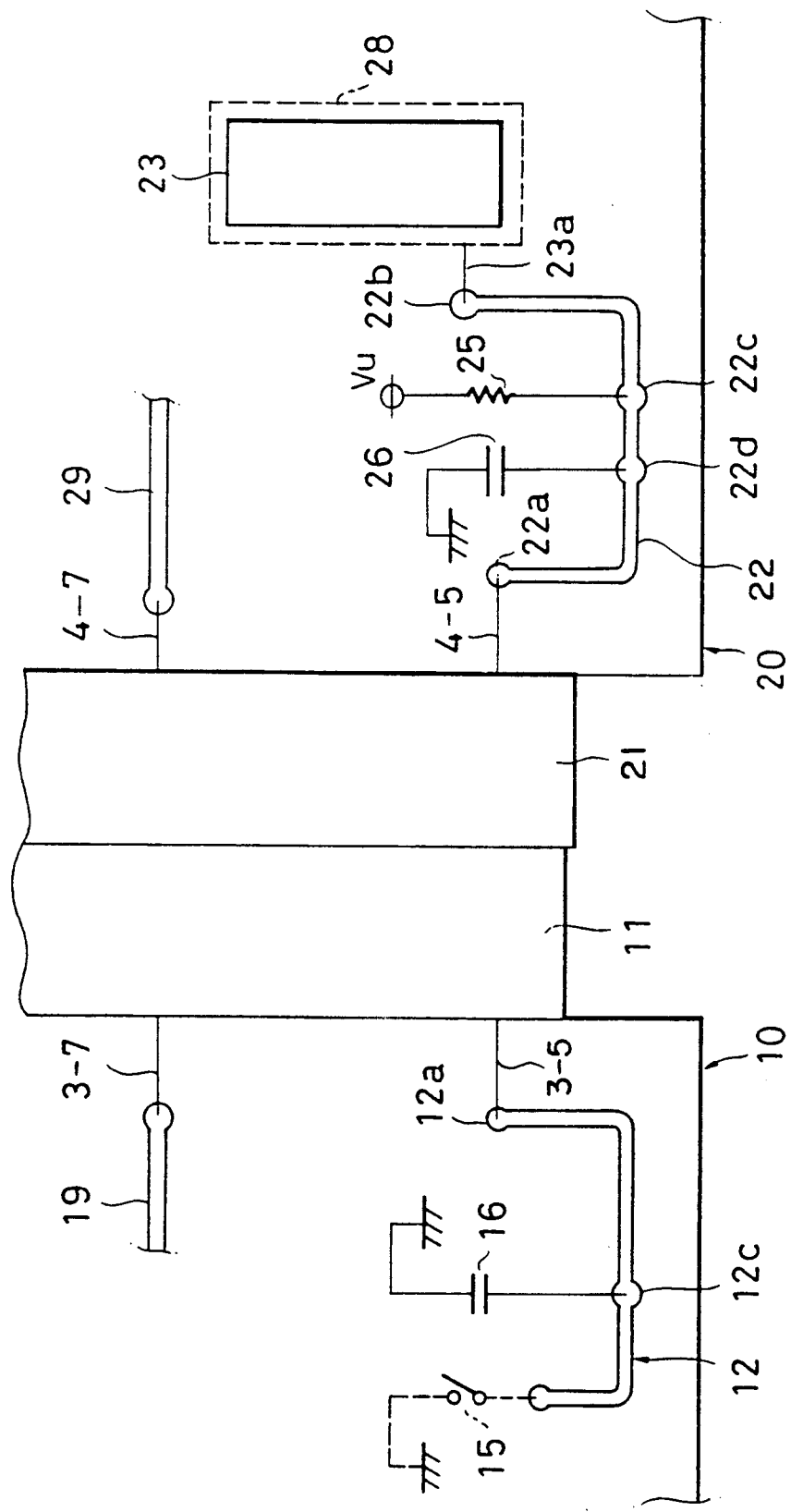
FIG. 2 is a plan view showing the pair of printed circuit boards in FIG. 1.

An embodiment of the invention will now be described with reference to the drawings. As illustrated in FIG. 1 and FIG. 2, a transmission device of this embodiment comprises a first printed circuit board 10, a first connector 11 connected to the first printed circuit board 10, and a first transmission path 12 which is in the form of a printed conductor and is provided or formed on the first printed circuit board 10, and which is connected at a point 12a to the connector 11.

The first transmission path 12 assumes one of a plurality of states, e.g., a grounded state and an open (floating) state. The state which the first transmission path 12 assumes is determined at the time the printed circuit board 10 is fabricated, or at the time a mode of operation of the printed circuit board 10 is selected by means of a jumper switch. The selection of the state at the time of fabrication or by means of a jumper switch is schematically illustrated by a switch 15 in a broken line. The selected state is not altered during the operation of the transmission device. Thus, it can be said that a signal which does not vary with time is present or transmitted over the first transmission path 12.

As shown in FIG. 2, a capacitor 16 is provided on the first printed circuit board 10. One electrode of the capacitor 16 is connected to the first transmission path 12 at point 12c. The other electrode of the capacitor 16 is connected to ground.

Figure 2A:
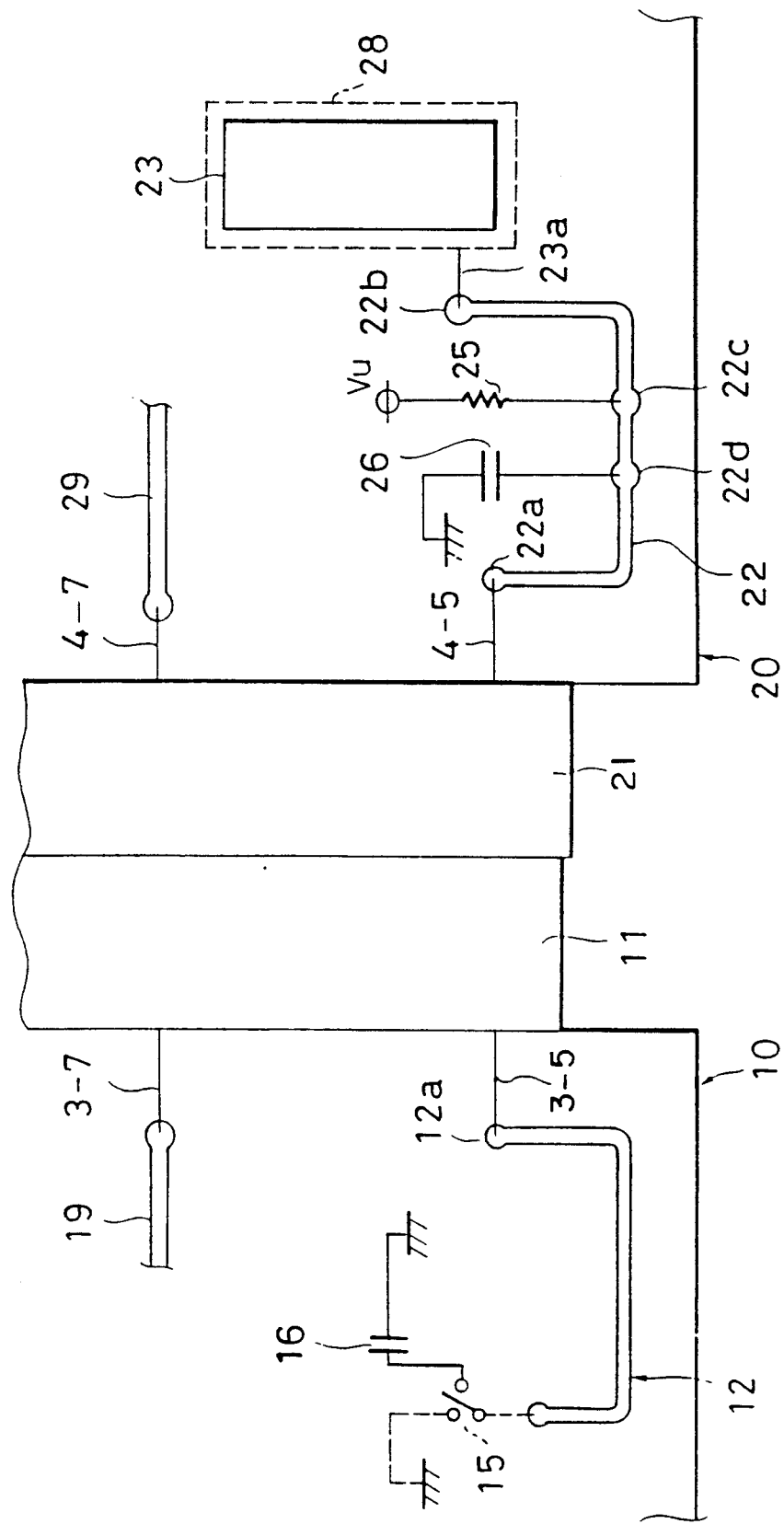
FIG. 2A is a plan view showing a modification of the printed circuit boards of FIG. 2.

In a modification shown in FIG. 2A, switch 15 is provided to connect the transmission path 12 to the ground either directly or via capacitor 16.

The transmission device further comprises a second printed circuit board 20, a second connector 21 connected to the first connector 11 and to the second printed circuit board 20, and a second transmission path 22, which is in the form of a printed conductor and is provided or formed on the second printed circuit board 20, and is connected at a point 22a to the second connector 21. A receiver circuit 23, formed in an IC 28, is mounted on the second printed circuit board 20. An input terminal 23a of the receiver circuit 23 is connected to a point 22b of the second transmission path 22.

As is better seen from FIG. 3 to FIG. 6, the first connector 11 is in the form of a block 11a of an insulating material, such as a plastic material, and pins 1-1 to 1-15 extending parallel with each other and extending from one side to the opposite side of the block 11a. Similarly, the second connector 21 is in the form of a block 21a of an insulating material, such as a plastic material, and pins 2-1 to 2-15 extending parallel with each other and extending from one side to the opposite side of the block 21a.

The pins of the first connector 11 are of a female-type and the pins of the second connector 21 are of a male-type, and the pins of the first and the second connectors 11 and 21 can mate with each other to provide electrical connection, as the connectors 11 and 21 are joined or engaged with each other.

The transmission path 12 is connected at the point 12a with one of the pins of the connector 11, e.g., the pin 1-5 via a lead 3-5. The transmission path 22 is connected at the point 22a with one of the pins of the connector 21, e.g., the pin 2-5 via a lead 4-5. The pins 1-5 and 2-5 are disposed to mate with each other when the connectors 11 and 21 are engaged with each other.

The transmission paths 12 and 22 are thus connected with each other via the mating pins, e.g., 1-5 and 2-5, which mate with each other, so that the above-mentioned signal which does not vary with time is transmitted from the transmission path 12 to the transmission path 22.

A resistor 25 is connected to couple the second transmission path 22 with a power supply Vu of the second printed circuit board 20. A capacitor 26 is connected to couple the second transmission path 22 with the ground at port 22d. The resistor 25 is connected to the second transmission path 22 at a point 22c between the point 22a where the second transmission path 22 is connected to the second connector 21 and the point 22b where the second transmission path 22 is connected to the input of the receiver circuit 23. Similarly, the capacitor 26 is connected to the second transmission path 22 at a point 22d between points 22a and 22b.

An additional transmission path 19, which is also in the form of a printed conductor, is provided or formed on the first printed circuit board 10. A signal, e.g., a clock signal which varies with time is transmitted over this additional transmission path 19. The additional transmission path 19 on the first printed circuit board 10 is connected via a lead 3-7 to a pin 1-7 in the first connector 11.

An additional transmission path 29, which is also in the form of a printed conductor, is also provided or formed on the second printed circuit board 20. The additional transmission path 29 on the second printed circuit board 20 is connected via a lead 4-7 to a pin 2-7 in the second connector 21. The additional pins 1-7 and 2-7 are connected with each other as the connectors 11 and 21 are engaged with other, so the transmission paths 19 and 29 are connected with each other via the mating pins 1-7 and 2-7, and the above-mentioned signal which varies with time is transmitted from the transmission path 19 to the transmission path 29. Since the additional pins 1-7 and 2-7 are disposed in the same connectors 11 and 21 as the pins 1-5 and 2-5, there can be certain crosstalk between these pins, with the effect of the crosstalk being greater as the distance between the pins 1-5 and 2-5, and the pins 1-7 and 2-7 is closer and as the signal transmitted through the pins 1-7 and 2-7 has higher frequency components. However, the crosstalk is reduced by the novel feature of the invention. That is, the transmission paths 12 and 22 are effectively grounded by the capacitors 16 and 26 for alternating-current components. The grounding effect is greater for higher-frequency components. The crosstalk from the pins 1-7 and 2-7 for the additional transmission paths 19 and 29 to the pins 1-5 and 2-5 for the transmission paths 12 and 22 is therefore reduced.

If the pins connected to the transmission paths 12 and 22 which are effectively grounded by the capacitors in the above-described manner are disposed adjacent the pins connected to the transmission paths 19 and 29 for the signal which varies with time, the crosstalk can be further reduced.

The crosstalk can be further reduced if there are a plurality of transmission paths on each of the first and the second printed circuit boards 10 and 20, and which are effectively grounded by the capacitors in the above-described manner, and the pins connected to these effectively-grounded transmission paths are disposed to surround pins connected to the transmission paths over which a signal which varies with time is transmitted. For instance, where the pins are arranged in rows and columns to form a matrix as shown in FIG. 4 and FIG. 6, the pins, e.g., 1-6, 1-8, 1-2, 1-12, 2-6, 2-8, 2-2 and 2-12, connected to the transmission paths which are effectively grounded in the above-described manner may be disposed in the same rows and in the same column as and on both sides of the pins, e.g., 1-7 and 2-7, connected to the transmission paths for the signal which varies with time.

What is claimed is:

1. A transmission device comprising:
   a printed circuit board;
   a connector for respectively transmitting and receiving signals from and to the printed circuit board;
   a transmission path provided on the printed circuit board over which a signal which does not vary with time is transmitted;
   a resistor connected to couple the transmission path with a power supply of the printed circuit board; and
   a capacitor connected to couple the transmission path with ground for reducing crosstalk interference on said transmission path.

2. The device of claim 1, wherein said transmission path is connected to said connector;
   said device further comprising a receiver circuit having an input terminal connected to said transmission path.

3. The device of claim 2, wherein said transmission path is in the form of a printed conductor, and said receiver circuit is at least part of an IC chip.

4. The device of claim 1, wherein said connector is in the form of a block of an electrically insulating material having a plurality of pins extending parallel with each other and extending from one side to the opposite side of the block, wherein said transmission path is connected to one end of a first one of said pins.

5. The device of claim 4, further comprising an additional transmission path over which an input or output signal which varies with time is transmitted, and said additional transmission path is connected to a second one of said pins in said connector.

6. The device of claim 5, wherein said second one of said pins is disposed adjacent to said first one of said pins.

7. The device of claim 4, further comprising a plurality of additional transmission paths each connected to a respective one of said plurality of pins, with each of the additional transmission paths being associated with a capacitor connecting that transmission path to ground, and said plurality of pins connected to said plurality of additional transmission paths are disposed to surround an additional pin connected to a transmission path over which a time varying signal is transmitted.

8. The device of claim 5, wherein said signal which varies with time is a clock signal.

9. A transmission device comprising:
   a first printed circuit board;
   a first connector connected to the first printed circuit board;
   a first transmission path provided on the first printed circuit board, and connected to said connector, over which a signal which does not vary with time is transmitted;
   a second printed circuit board;

a second connector connected to the second printed circuit board, and being capable of connection with said first connector;

a second transmission path provided on the second printed circuit board, and connected to the second connector, over which said signal which does not vary with time is transmitted;

a first resistor connected to couple the second transmission path with a power supply of the second printed circuit board; and a first capacitor connected to couple the second transmission path with ground.

10. The device of claim 9, wherein said second transmission path is connected to the second connector, said device further comprising a receiver circuit mounted on said second printed circuit board, having an input terminal connected to the second transmission path.

11. The device of claim 10, wherein said first and second transmission paths are in the form of a printed conductor, and said receiver circuit comprises at least part of an IC chip.

12. The device of claim 11, wherein each of said first and second connectors is in the form of a block of an electrically insulating material having a plurality of pins extending parallel with each other and extending from one side to the opposite side of the block;

the pins of the first and the second connectors being capable of connection with each other; and said second transmission path is connected to one end of a first one of said pins of said second connector.

13. The device of claim 12, further comprising an additional transmission path on each of said first and second printed circuit boards, and over which a signal which varies with time is transmitted, said additional transmission path on said first printed circuit board being connected to a second one of said pins in said first connector, said additional transmission path on said second printed circuit board being connected to a second one of said pins in said second connector, and said second ones of said pins in said first and second connectors are connected to each other, and wherein said first transmission path is connected to one end of a first one of said pins in said first connector.

14. The device of claim 13, wherein said second ones of said pins are respectively disposed adjacent to said first ones of said pins in said first and second connectors.

15. The device of claim 13, wherein each of said first and second connectors has a plurality of first pins connected to respective transmission paths with each of the respective transmission paths being associated with a capacitor connecting that transmission path to ground, and said plurality of first pins in each of the first and second connectors are disposed to surround said second one of said pins thereof.

16. The device of claim 9, further comprising:

switch means having an output terminal connected to the first transmission path for causing said first transmission path to be in a grounded state or in an open state; and a capacitor having one electrode connected to the first transmission path and another electrode grounded.

17. The device of claim 13, wherein said signal which varies with time is a clock signal.

* * * * *

UNITED STATES PATENT AND TRADEMARK OFFICE
CERTIFICATE OF CORRECTION

PATENT NO. : 5,291,072
DATED      : March 1, 1994
INVENTOR(S): Naoki Hihara

It is certified that error appears in the above-identified patent and that said Letters Patent is hereby corrected as shown below:

Col. 3, line 14, "port" should be --point--.

Col. 4, line 65, "board," should be --board--.

Col. 5, line 5, "board," should be --board--.

Col. 5, line 20, "comprises" should be --is--.

Signed and Sealed this

Ninth Day of August, 1994

Attest:

BRUCE LEHMAN

*Attesting Officer*    *Commissioner of Patents and Trademarks*